US012566222B2

(12) United States Patent
Van Der Wiel

(10) Patent No.: US 12,566,222 B2
(45) Date of Patent: Mar. 3, 2026

(54) SEMICONDUCTOR DEVICE WITH EMBEDDED MAGNETIC FLUX CONCENTRATOR

(71) Applicant: Melexis Technologies SA, Bevaix (CH)

(72) Inventor: Appolonius Jacobus Van Der Wiel, Duisburg (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 18/311,374

(22) Filed: May 3, 2023

(65) Prior Publication Data

US 2023/0273272 A1 Aug. 31, 2023

Related U.S. Application Data

(63) Continuation of application No. 16/878,967, filed on May 20, 2020, now Pat. No. 11,668,766.

(30) Foreign Application Priority Data

May 24, 2019 (EP) .................................... 19176438

(51) Int. Cl.
*G01R 33/00* (2006.01)
*G01R 33/02* (2006.01)
(Continued)

(52) U.S. Cl.
CPC .......... *G01R 33/0011* (2013.01); *G01R 33/02* (2013.01); *H01L 23/5226* (2013.01);
(Continued)

(58) Field of Classification Search
CPC ................ G01R 33/0011; G01R 33/02; G01R 33/0052; G01R 33/0017; G01R 33/052;
(Continued)

(56) References Cited

U.S. PATENT DOCUMENTS 6,545,462 B2 4/2003 Schott et al.
7,358,724 B2 4/2008 Taylor et al.
(Continued)

FOREIGN PATENT DOCUMENTS

JP 2016100598 A * 5/2016
JP 2017166926 A 9/2017

OTHER PUBLICATIONS

JP 2016100598 A (Year: 2016).*
(Continued)

*Primary Examiner* — Latanya N Crawford Eason
(74) *Attorney, Agent, or Firm* — Workman Nydegger

(57) ABSTRACT

A magnetic flux concentrator (MFC) structure comprises a substrate, a first metal layer disposed on or over the substrate, and a second metal layer disposed on or over the first metal layer. Each metal layer comprises (i) a first wire layer comprising first wires conducting electrical signals, and (ii) a first dielectric layer disposed on the first wire layer. A magnetic flux concentrator is disposed at least partially in the first metal layer, in the second metal layer, or in both the first and the second metal layers. The structure can comprise an electronic circuit or a magnetic sensor with sensing plates. The structure can comprise a transformer or an electromagnet with suitable control circuits. The magnetic flux concentrator can comprise a metal stress-reduction layer in the first or second wire layers and a core formed by electroplating the stress-reduction layer.

19 Claims, 11 Drawing Sheets

(51) Int. Cl.

| | |
|---|---|
| *H01L 23/522* | (2006.01) |
| *H01L 23/528* | (2006.01) |
| *H01L 23/58* | (2006.01) |
| *H10N 52/00* | (2023.01) |
| *H10N 52/01* | (2023.01) |
| *H10N 52/80* | (2023.01) |

(52) U.S. Cl.
CPC ............ *H01L 23/528* (2013.01); *H01L 23/58* (2013.01); *H10N 52/01* (2023.02); *H10N 52/101* (2023.02); *H10N 52/80* (2023.02)

(58) Field of Classification Search
CPC .. G01R 33/047; G01R 33/072; G01R 33/075; G01R 33/077; G01R 33/04; H01L 43/065; H01L 43/14; H01L 43/00; H01L 23/5226; H01L 23/528; H01L 23/58; H10N 52/01; H10N 52/101; H10N 52/80
See application file for complete search history.

(56) References Cited

U.S. PATENT DOCUMENTS

| | | | |
|---|---|---|---|
| 9,018,028 | B2 | 4/2015 | Ryu et al. |
| 9,781,834 | B1 | 10/2017 | Sturcken et al. |
| 9,857,437 | B2 | 1/2018 | Taylor et al. |
| 10,429,453 | B2 | 10/2019 | Hioka et al. |
| 2009/0137066 | A1* | 5/2009 | Imai ........................ H10N 52/01 |
| | | | 257/E21.001 |
| 2011/0210722 | A1 | 9/2011 | Paci et al. |
| 2013/0207650 | A1 | 8/2013 | Koop |
| 2014/0071636 | A1* | 3/2014 | Sturcken ................. H01F 27/24 |
| | | | 336/200 |
| 2014/0367813 | A1* | 12/2014 | Ryu ........................ H10N 52/80 |
| | | | 257/421 |
| 2017/0267521 | A1 | 9/2017 | Stringer et al. |
| 2017/0269169 | A1 | 9/2017 | Hioka et al. |
| 2017/0290157 | A1 | 10/2017 | Sturcken et al. |
| 2018/0295725 | A1* | 10/2018 | Sturcken ................ H05K 1/115 |
| 2019/0107585 | A1 | 4/2019 | Huber Lindenberger et al. |
| 2020/0091415 | A1* | 3/2020 | Burssens ................ G01R 33/24 |
| 2021/0066273 | A1 | 3/2021 | Myasishchev et al. |

OTHER PUBLICATIONS

European Search Report for corresponding EP application No. 19176438.0 mailed Nov. 7, 2019.

Chinese Office Action from Corresponding Chinese Patent Application No. CN202010440102.0, Sep. 25, 2025.

* cited by examiner

SEMICONDUCTOR DEVICE WITH EMBEDDED MAGNETIC FLUX CONCENTRATOR

FIELD OF THE INVENTION

The present invention is generally related to the field of semiconductor devices with magnetic flux concentrators and magnetic sensors.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or can incorporate magneto-resistive materials whose electrical resistance changes in response to an external magnetic field. In many applications, it is desirable that magnetic sensors are small and sensitive and are integrated with electronic processing circuitry so as to reduce the overall magnetic sensor size and provide improved measurements and integration into external electronic systems.

U.S. Pat. No. 9,857,437 B2 describes a Hall-effect magnetic sensor for measuring magnetic fields incorporating an integrated circuit formed in a semiconductor material on a substrate, together with insulation and adhesion layers. An adhesion layer and an insulation layer are formed on the integrated circuit substrate and the Hall-effect sensing element is located on the adhesion layer. A passivation layer is formed over the Hall-effect sensing element. JP2017166926 teaches a magnetic flux converging plate on an adhesive layer coated over a semiconductor substrate with a magnetic sensor on an opposite side of the semiconductor substrate. U.S. Pat. No. 9,018,028 B2 discloses a magnetic sensor with a substrate with Hall sensor elements, a protective layer disposed on the substrate, a base layer on the protective layer and an integrated magnetic concentrator on the base layer.

U.S. Pat. No. 6,545,462 B2 describes a sensor for the detection of the direction of a magnetic field having magnetic flux concentrators and Hall elements. Magnetic flux concentrators are metal structures with soft magnetic characteristics that can amplify a magnetic field, such as a planar magnetic field, and can be used to convert the field into a differential vertical field. The Hall elements are arranged in an area near the edge of the magnetic field concentrator. The magnetic flux concentrator is disposed on a semiconductor chip, for example a CMOS integrated circuit, in which the Hall-effect sensors are formed in either a vertical or horizontal configuration. The magnetic flux concentrator is positioned over the semiconductor chip.

U.S. Pat. No. 7,358,724 B2 describes a substrate having a depression into which a magnetic material is disposed. The magnetic material forms a magnetic flux concentrator and a magnetic field sensing element can be disposed proximate to the depression.

Integrated circuits can have very small components or structures, for example having sizes in the tens of microns, or even less. It is therefore desirable to reduce the size of integrated magnetic sensors as well, but it can be difficult to combine magnetic sensing structures with a magnetic flux concentrator to provide adequate sensitivity.

Magnetic flux concentrators (MFCs) are also known as integrated magnetic concentrators (IMCs).

There is a need therefore, for space-efficient and small structures and effective methods for providing magnetic flux concentrators for a variety of purposes, including magnetic-field sensing.

SUMMARY OF THE INVENTION

It is an object of embodiments of the present invention to provide for a structure and method to embed magnetic-flux-concentrator in an integrated circuit in a space-efficient way.

The above objective is accomplished by the solution according to the present invention.

According to some embodiments of the present invention, a magnetic-flux-concentrator structure comprises: a substrate; a first metal layer comprising (i) a first wire layer disposed on or over the substrate, said first wire layer comprising first wires conducting electrical signals, and (ii) a first dielectric layer disposed on the first wire layer; a second metal layer comprising (i) a second wire layer disposed on or over the first metal layer, said second wire layer comprising second wires conducting electrical signals, and (ii) a second dielectric layer disposed on the second wire layer; and a magnetic flux concentrator (MFC) disposed at least partially in the first metal layer, in the second metal layer, or in both the first and the second metal layers. The MFC can be disposed on or comprise a first wire or a second wire.

According to some embodiments of the present invention, the magnetic flux concentrator is disposed at least partially in the first wire layer of the first metal layer, in the second wire layer of the second metal layer, or in both the first wire layer and the second wire layer.

According to some embodiments of the present invention, the magnetic flux concentrator has (i) a lateral dimension of 130 microns or less, 100 microns or less, or 50 microns or less, (ii) the magnetic flux concentrator has a thickness of 15 microns or less, 10 microns or less, or 5 microns or less, or (iii) both (i) and (ii).

According to some embodiments of the present invention, the second dielectric layer comprises an MFC via and the magnetic flux concentrator is disposed at least partially in the MFC via.

According to some embodiments of the present invention, one or more wires are disposed in or on the substrate, the wires forming one or more coils around the magnetic flux concentrator. The one or more coils around the magnetic flux concentrator can form a transformer or an electromagnet.

According to some embodiments of the present invention, the substrate is a semiconductor substrate comprising an electronic circuit disposed in or on the semiconductor substrate and wherein the electronic circuit has a feature size less than or equal to 200 nm, less than or equal to 180 nm, or less than or equal to 110 nm. According to some embodiments of the present invention, (i) the first wires are electrically connected to the electronic circuit, (ii) the second wires are electrically connected to the electronic circuit, or (iii) both (i) and (ii).

According to some embodiments of the present invention, the magnetic-flux-concentrator structure comprises a magnetic sensor disposed at least partially in the first metal layer, between the substrate and the first metal layer, in the substrate or on a side of the substrate opposite the magnetic flux concentrator. According to some embodiments of the present invention, (i) the first wires are electrically connected to the magnetic sensor, (ii) the second wires are electrically connected to the magnetic sensor, or (iii) both (i) and (ii). According to some embodiments of the present invention, at least a portion of the magnetic sensor is within 10 microns, 8 microns, 5 microns, 3 microns, 2 microns or 1 micron of the magnetic flux concentrator. According to some embodiments of the present invention, the magnetic sensor is a Hall-effect sensor comprising a sensing plate. The sensing plate can be disposed in a doped semiconductor region of the substrate, for example under the first metal layer as an n-doped diffusion portion of the substrate in a CMOS circuit or a magnetic-sensor circuit. Such a portion of the substrate can comprise further dielectric and conductive layers.

According to some embodiments of the present invention, the magnetic flux concentrator comprises a core disposed at least partially in the second dielectric layer and a stress-reduction layer disposed in the second wire layer. According to some embodiments of the present invention, the stress-reduction layer has a ductility greater than a ductility of the magnetic flux concentrator, the stress-reduction layer is electrically conductive, or the stress-reduction layer is or comprises a ductile metal found in CMOS or magnetic-sensor circuits, for example aluminium, or any combination of these. According to some embodiments, the stress-reduction layer is a multi-layer comprising a first layer that is electrically conductive and ductile and a second layer that is a seed layer, the second layer disposed on the first layer. The seed layer can provide a compatible surface for electro-plating the core and can be electrically connected to the substrate for providing electro-plating current.

According to some embodiments of the present invention, the magnetic flux concentrator is electrically connected to an electrical connection in the first metal layer or to the substrate, for example the stress-reduction layer is in electrical contact with the core and to the substrate or to a first wire in the first metal layer for electroplating the core.

According to some embodiments of the present invention, the magnetic flux concentrator is mechanically isolated from the dielectric layer(s) in which it is formed.

According to some methods of the present invention, a magnetic-flux-concentrator structure is constructed by providing a substrate, forming one or more metal layers on or over the substrate, each metal layer comprising a wire layer and a dielectric layer disposed over the wire layer, forming an MFC via in one or more of the dielectric layers, and disposing a magnetic flux concentrator in the MFC via. According to embodiments of the present invention, the magnetic flux concentrator comprises a stress-reduction layer and a core and is disposed in the MFC via by etching one or more dielectric layers to expose a wire having a two-dimensional area (e.g., a contact area or contact pad) in a wire layer. The exposed wire is electrically connected to a current source and the core is electroplated on the two-dimensional area of the exposed wire. The area of the exposed wire can form a stress-reduction layer between the core and the substrate.

According to some embodiments of the present disclosure, the electrical connection between the current source and the exposed wire can be electrically connected to a seal ring of a CMOS circuit for controlling the MFC. Thus, the exposed area is electrically contacted to the wafer substrate and the seal ring provides a substrate contact for all metal layers through which a plating current can be provided to all exposed areas by simply connecting the wafer edge to a current source. The substrate distributes the electro-plating current to all seal rings and from the seal rings to all exposed areas. As the seal rings have a high conductivity and have a relatively large contact area, the seal rings lower the resistance of the substrate. Thus, according to some embodiments, the magnetic-flux-concentrator structure comprises an electronic circuit and a seal ring disposed around the electronic circuit, and the seed layer is electrically connected to the substrate through the seal ring.

According to some embodiments of the present disclosure, a method of making a magnetic-flux-concentrator structure comprises providing a substrate, disposing a first metal layer on or over the substrate, the first metal layer comprising (i) a first wire layer disposed on or over the substrate, the first wire layer comprising first wires conducting electrical signals, and (ii) a first dielectric layer disposed on the first wire layer, disposing a second metal layer on or over the first metal layer, the second metal layer comprising (i) a second wire layer disposed on or over the first metal layer, the second wire layer comprising second wires conducting electrical signals, and (ii) a second dielectric layer disposed on the second wire layer, and disposing a magnetic flux concentrator at least partially in the first metal layer, in the second metal layer, or in both the first and the second metal layers. Some embodiments comprise disposing an electroplating seed layer on the second wire layer before disposing the second dielectric layer.

In embodiments of the present invention, the magnetic flux concentrator is disposed at least partially in the first wire layer of the first metal layer, in the second wire layer of the second metal layer, or in both the first wire layer and the second wire layer.

Embodiments of the present invention provide space-efficient and small magnetic sensors with integrated magnetic flux concentrators that provide improved sensitivity in a semiconductor device.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The foregoing and other objects, aspects, features, and advantages of the present disclosure will become more apparent and better understood by referring to the following description taken in conjunction with the accompanying drawings.

DETAILED DESCRIPTION OF ILLUSTRATIVE EMBODIMENTS

Figure 1:
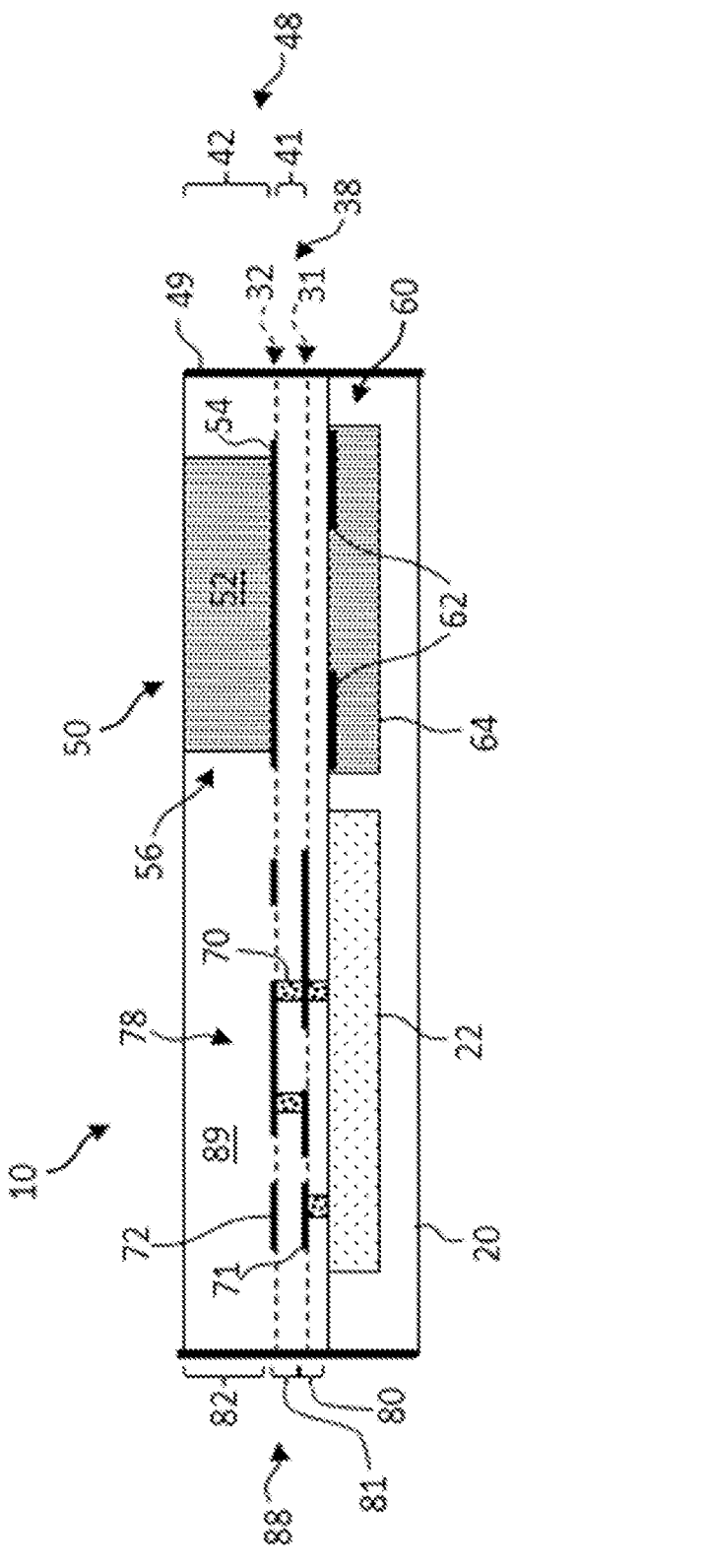
FIG. 1 is a cross section comprising a magnetic sensor according to illustrative embodiments of the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments of the present invention provide structures and methods for integrating magnetic flux concentrators (MFCs) or integrated magnetic concentrators (IMC s) within the metal layers provided in an integrated circuit structure. Integrated circuits can comprise a semiconductor substrate in which active electronic components are formed and patterned metal layers interconnecting the electronic components on or above the semiconductor substrate. The MFCs in the metal layers can be used for a variety of purposes, including, for example, magnetic-field sensing, alternating current voltage transformation (a transformer), voltage conversion and active magnetic-field generation. Circuits and wires can be provided with the MFCs to control the integrated circuit structure, for example to sense magnetic fields or to otherwise employ magnetic fields in electronic or magnetic systems. Some embodiments of the present disclosure can use Hall-effect magnetic sensors.

By integrating MFCs in an integrated circuit structure within a conventional integrated circuit work flow, smaller and more sensitive devices can be provided with reduced manufacturing costs. Embodiments of the present invention provide a structure and a method to embed a magnetic concentrator inside the metal layer stack of an integrated circuit and therefore decreases the distance between a magnetic flux concentrator and magnetic sensor under or in the metal stack, reducing device size, increasing device sensitivity, and reducing manufacturing steps. Embodiments of the present invention also enable inductors or wire coils formed in integrated circuit metal layers.

Integrated circuits are widely used in electronic systems to control or operate a system or to sense, respond to or affect environmental attributes. Such integrated circuits are generally formed in a semiconductor substrate. With appropriate processing, the semiconductor substrate can provide sensing and operational electronic circuits (e.g., control circuits and Hall-effect magnetic sensors). In a typical integrated circuit manufacturing process, transistors are first formed directly in a semiconductor substrate, for example a silicon substrate, using front-end-of-line processes that, for example, form doped transistor sources and drains and form dielectric gate structures on a process side of the semiconductor substrate. Hall-effect plates are typically also formed on the process side of the semiconductor substrate. Once the various semiconductor devices have been constructed, they are electrically connected through wires formed in one or more patterned metal layers disposed in a stack on the semiconductor process side to form electrically connected circuits. The metal layers are typically constructed using back-end-of-line processes by blanket depositing a metal layer and then using photoresists patterned with light through masks that can be etched to form patterned wires. Multiple metal layers of patterned wires are often needed. For complex circuits, four or more layers can be used. Wires in each metal layer can be isolated from wires in layers above or below with a dielectric layer. Electrical interconnections between the layers are formed through vias etched in the intervening dielectric layer and filled or coated with an electrically conductive metal. The various layers are usually planarized to provide a flat surface on which the optical photolithography equipment can maintain an exact focus over the large areas of current semiconductor wafers. The wires in the metal layers can electrically conduct power and ground signals as well as analog or digital information signals, such as control or data signals. The wires in the metal layers can be information signal conductors or form ground or power planes or can have an effective two-dimensional area as a contact pad or contact area.

Figure 12:
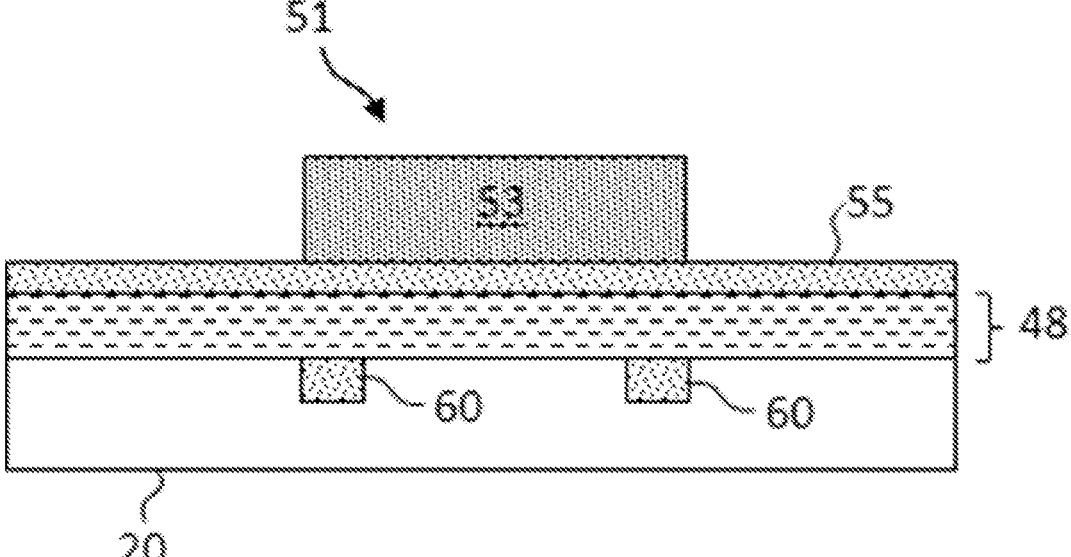
FIG. 12 represents a cross section useful in understanding the prior art and embodiments of the present invention.

Referring to FIG. 12, conventional magnetic flux concentrators (MFC) 51 comprise a core 53 provided on a polyimide layer 55 disposed on a semiconductor substrate 20. Magnetic sensors 60 can comprise Hall-effect plates through which a current is conducted in a magnetic field concentrated by MFC 51 and across which the voltage is measured to determine the magnetic field magnitude. The Hall-effect plates are typically disposed at the edges of core 53. Circuits, for example analog or digital circuits, CMOS circuits, bipolar circuits, or mixed signal circuits, can be provided to control, sense or otherwise employ electrical signals or currents in conjunction with MFC 51 and an ambient external or a generated magnetic field. Such circuits can also comprise dielectric and wire layers.

Because cores 53 typically comprise a magnetic metal, such as iron or cobalt, or comprise iron alloys, such as nickel-iron, and have a coefficient of thermal expansion (CTE) quite different from the coefficient of thermal expansion of substrate 20 on which MFC 51 is disposed, for example a semiconductor substrate, when the device is operated and heats up, the mechanical stress produced by the differences in CTE of MFC 51 and substrate 20 can cause the device to fail. To help mitigate such mechanical stress, a stress-reduction layer can be provided between MFC 51 and substrate 20, for example a layer 55 of organic material such as polyimide. Typical integrated circuits of the prior art employ one or more protective passivation layers and a stress buffer, such as polyimide layer 55, placed between magnetic-flux-concentrator core 53 and the passivation assures that the thermal expansion of magnetic-flux-concentrator core 53 with respect to substrate 20 does not damage the passivation of the circuit.

The magnetic gain of a magnetic flux concentrator is proportional to the ratio of its diameter and thickness and the distance from the edge of the magnetic flux concentrator to the magnetic sensor. As a consequence, in a conventional structure the distance between the surface of substrate 20 with the Hall-effect plates and the edge of magnetic-flux-concentrator 53 is determined by the thickness of the metal layer stack 48 of the integrated circuit and the stress buffering layer (e.g., polyimide layer 55), for example 12 microns or more in a CMOS integrated circuit with more than four metal layers and a polyimide stress reduction layer.

Hence, the conventional structure illustrated in FIG. 12 (and referenced, for example in U.S. Pat. No. 6,545,462) has limitations, particular in the context of small integrated circuits. Integrated circuits typically employ passivation and dielectric layers between interconnection layers (e.g., wire layers with patterned wires) and active element (e.g., transistor) layers. The passivation and dielectric layers do not shrink as the interconnection and active elements are reduced in size due to improvements in photolithography and the number of metal layers 48 in the integrated circuit tends to increase due to the increased number of transistors in the integrated circuit. Thus, the distance between Hall-effect plates and magnetic flux concentrators 51 increases and consequently relatively larger Hall-effect plates are required.

Therefore, the Hall-effect plates cannot grow smaller as the circuits and wires improve in resolution and eventually the Hall-effect plates become too large to be cost effective in the integrated circuit and too far away from magnetic flux concentrator 50 to provide adequate sensitivity. This problem becomes increasingly serious as the resolution (feature size) of the integrated circuit reaches 200 nm or less, for example 180 nm or less or 110 nm or less, particularly for digital CMOS integrated circuits.

Figure 2:
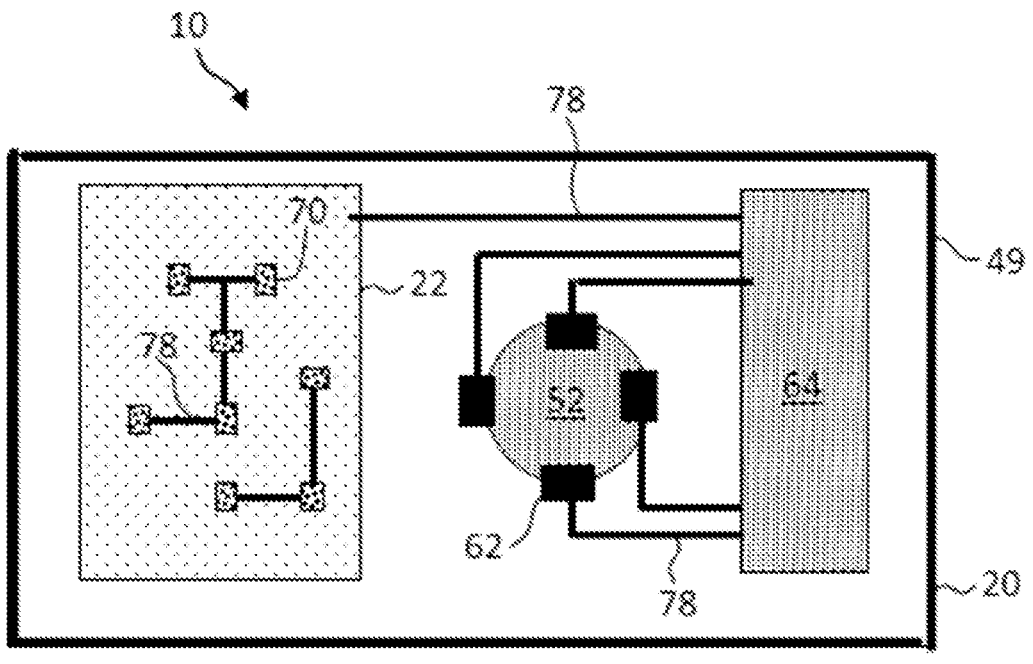
FIG. 2 is a partial plan view according to illustrative embodiments of the present invention similar to FIG. 1.
Figure 3:
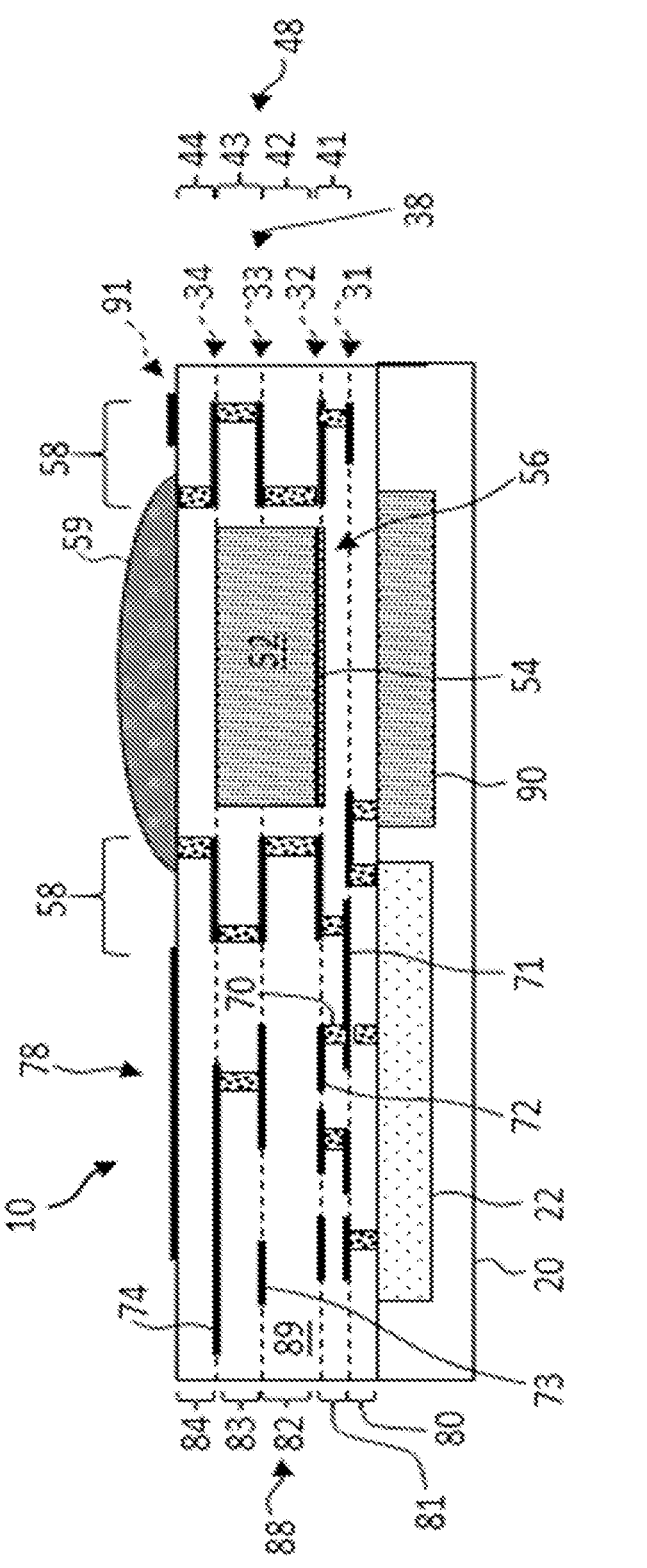
FIG. 3 represents a cross section comprising a coil and a wire redistribution layer according to illustrative embodiments of the present invention.

To overcome this problem and according to embodiments of the present disclosure illustrated in FIGS. 1 and 2, a magnetic flux concentrator (MFC) structure 10 comprises magnetic flux concentrators 50 provided within metal layers 48 disposed on or over an integrated-circuit substrate 20. Substrate 20 can be a semiconductor substrate and can comprise an integrated electronic circuit 22 comprising active electronic transistors and diodes, as well as other electronic components, such as Hall-effect plates. Metal layers 48 comprise at least a first metal layer 41 disposed on or over substrate 20 and a second metal layer 42 disposed on or over first metal layer 41. First metal layer 41 comprises (i) a first wire layer 31 disposed on or over substrate 20 comprising patterned first wires 71 conducting electrical signals, and (ii) a first dielectric layer 81 disposed on first wire layer 31 on a side of first wire layer 31 opposite substrate 20. First wire layer 31 can be disposed directly on substrate 20 or on a layer disposed on substrate 20. For example, substrate 20 can be coated with or comprise a planarizing dielectric layer 80 as the surface of substrate 20. Dielectric layer 80 can also comprise additional wires or wire connections. First wires 71 conduct electrical signals, for example power, ground or information signals. A second metal layer 42 is disposed on first metal layer 41 and comprises (i) a second wire layer 32 comprising second wires 72 conducting electrical signals, and (ii) a second dielectric layer 82 disposed on second wire layer 32 on a side of second wire layer 32 opposite substrate 20, first wire layer 31, and first dielectric layer 81. As with first wire layer 31, second wire layer 32 conducts electrical signals, for example power, ground or information signals, can be patterned, and can comprise individual wires 78 or electrical buses. In general, wires 78 as shown in the Figures can be individual wires 78 conducting a single signal or multiple wires (for example a bus comprising parallel multiple wires) conducting multiple signals. A magnetic flux concentrator 50 is disposed at least partially in first metal layer 41, at least partially in second metal layer 42, or at least partially in first metal layer 41 and at least partially in second metal layer 42. In some embodiments additional metal layers 48 (each comprising a dielectric layer 88 over a wire layer 38) are disposed in layers over second metal layer 42 so that magnetic flux concentrator 50 extends through the additional metal layers 42. In some embodiments magnetic flux concentrator 50 is present in only some metal layers 48, for example first metal layer 41 or, as shown in FIG. 3, second and third metal layers 42, 43. Magnetic flux concentrator 50 can be disposed on or comprise a wire 78 in any of wire layers 38 of metal layers 48.

As described herein, wire layer(s) 38 refer generically to any wire layers in magnetic-flux-concentrator structure 10 (for example first and second wire layers 31, 32). Metal layer(s) 48 refer generically to any metal layers in magnetic-flux-concentrator structure 10 (for example first and second metal layers 41, 42). Dielectric layer(s) 88 refer generically to any dielectric layers in magnetic-flux-concentrator structure 10 (for example planarizing dielectric layer 80, first dielectric layer 81 and second dielectric layer 82). Wire(s) 78 refer generically to any wires or combination of wires such as electrical buses, formed by patterning any wire layer 38 (for example first wire 71 or second wire 72). Wires 78 in different wire layers 38 can be electrically connected through electrical vias 70. Electrical vias 70 are electrically conductive connections through any dielectric layers 88 between wires 78 in different wire layers 38 and can be formed by photolithographic etching a hole in the dielectric layer(s) 88 and coating or filling the hole with an electrically conductive metal, for example tungsten, titanium, copper or aluminium.

Figure 8:
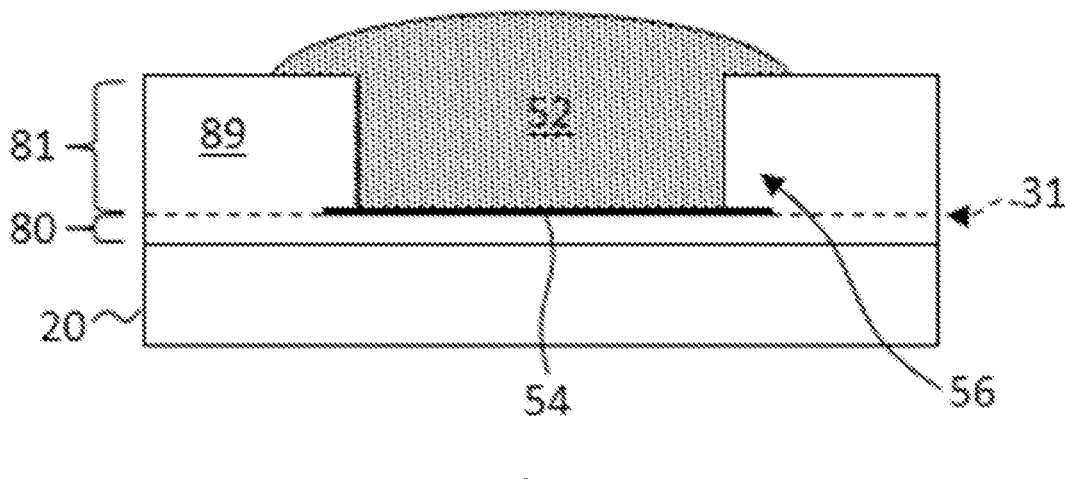
FIG. 8 represents a cross section comprising a magnetic flux concentrator and an electrically conductive stress-reduction layer according to illustrative embodiments of the present invention.

Conventionally, a metal layer can refer only to patterned wire layers 38, but as used herein, a metal layer 48 refers to both a wire layer 38 and a dielectric layer 88 coated over wire layer 38 (for example first wire layer 31 and first dielectric layer 81 form first metal layer 41 and second wire layer 32 and second dielectric layer 82 form second metal layer 42, and so on) so that, as shown in FIG. 1, magnetic flux concentrator 50 is disposed in at least one of second wire layer 32, second dielectric layer 82, or both second wire layer 32 and second dielectric layer 82, so that magnetic flux concentrator 50 is at least partially in second metal layer 42. According to some embodiments of the present disclosure, magnetic flux concentrator 50 is also at least partially in first metal layer 41 (as shown in FIG. 8). In some embodiments a top dielectric layer 88 or encapsulation layer 92 forms a surface of substrate 20.

Magnetic flux concentrators 50 serve to concentrate magnetic fields and make the concentrated magnetic fields more readily detected and measured. In some embodiments magnetic flux concentrators 50 can comprise a core 52, for example comprising a magnetic metal such as iron or cobalt, or a metal alloy comprising a magnetic metal such as nickel-iron, disposed at least partially in first or second metal layer 41, 42, or both. Second dielectric layer 82 can comprise an MFC via 56 (a hole in second dielectric layer 82) in which magnetic flux concentrator 50 can be at least partially disposed. For example, core 52 can be disposed in MFC via 56. Magnetic flux concentrators 50 can also comprise a stress-reduction layer 54, for example provided in contact with core 52. Stress-reduction layer 54 can be disposed in second metal layer 42 and specifically in second wire layer 32 (as shown in FIG. 1) or in first wire layer 31 (as shown in FIG. 8, discussed below) and can also be provided in MFC via 56, for example at the bottom of MFC via 56 (the bottom of MFC via 56 is the portion of MFC via 56 closest to substrate 20). Thus, in some embodiments of the present disclosure, magnetic flux concentrators 50 are at least partially present in second metal layer 42 (and therefore in both second wire layer 32 and second dielectric layer 82 comprising second metal layer 42). In some embodiments of the present disclosure, magnetic flux concentrators 50 are at least partially present in first metal layer 41 and second metal layer 42 (and therefore in first wire layer 31 and first dielectric layer 81 comprising first metal layer 41 and in second wire layer 32 and second dielectric layer 82 comprising second metal layer 42). Since, in some embodiments, additional metal layers 48 are disposed over second metal layer 42, MFC via 56 can extend through the additional metal layers 48. Additional metal layers 48 can also be disposed under first metal layer 41.

Stress-reduction layer 54 reduces stress created by any different coefficients of thermal expansion of core 52 and substrate 20. To this end, stress-reduction layer 54 can have a ductility greater than a ductility of core 52. In some embodiments, stress-reduction layer 54 is electrically conductive, can be in electrical and physical contact with core 52, and can comprise or be aluminium. By providing an electrically conductive stress-reduction layer 54 of a metal more ductile than core 52 in electrical and physical contact with core 52, core 52 can be made using electroplating techniques without the use of sputtered and patterned seed layers formed on top of substrate 20, as discussed further below.

Figure 4:
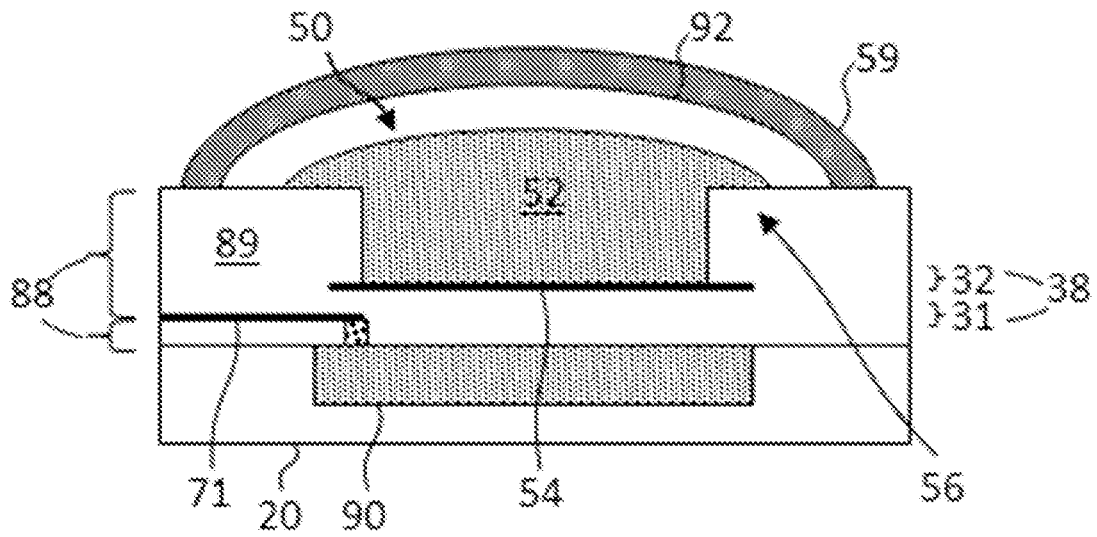
FIG. 4 represents a cross section comprising an encapsulation layer and a wire redistribution layer according to illustrative embodiments of the present invention.

Therefore, according to some embodiments of the present disclosure, magnetic-flux-concentrator structure 10 can be constructed by providing a substrate 20, forming one or more metal layers 48 on or over substrate 20, each metal layer 48 comprising a wire layer 38 and a dielectric layer 88 disposed over wire layer 38, forming an MFC via 56 in one or more dielectric layers 88, and disposing a magnetic flux concentrator 50 in MFC via 56. According to embodiments of the present invention, magnetic flux concentrator 50 comprises a stress-reduction layer 54 and a core 52 and is disposed in MFC via 56 by etching one or more dielectric layers 88 to expose a wire 78 having an effective two-dimensional area (e.g., a contact area or contact pad) in a wire layer 38. The effective two-dimensional area of stress-reduction layer 54 can extend across the entire bottom of MFC via 56, or vice versa. In some embodiments stress-reduction layer 54 extends beyond MFC via 56 and beyond core 52 in order to reduce stress gradients present at the edge of core 52 and reduce cracking in substrate 20 layers, for example dielectric or semiconductor layers, adjacent to or below core 52, as shown in FIGS. 4 and 8. Exposed wire 78 is electrically connected to an external current source and core 52 is electroplated on the area of exposed wire 78. According to some embodiments of the present invention, exposed wire 78 can serve as an etch stop for etching MFC via 56, can provide a conductive area that provides electrical current for plating core 52 in MFC via 56, can provide a sub-layer for seed layer 57 deposition enabling electroplating, and can serve as a stress-reduction layer 54.

According to some embodiments of the present disclosure, substrate 20 of magnetic-flux-concentrator structure 10 is a semiconductor substrate comprising an electronic circuit 22, for example an integrated circuit constructed using photolithographic methods and materials, disposed in or on the semiconductor substrate. Electronic circuit 22 can comprise doped or implanted semiconductor structures that have a feature size less than or equal to 200 nm, less than or equal to 180 nm, or less than or equal to 110 nm. Electronic circuit 22 can be a digital, analog or mixed-signal circuit and can be constructed as a CMOS circuit in a silicon substrate 20. As noted above, when the resolution (feature size) of an integrated circuit reaches these sizes, conventional methods and devices for measuring magnetic fields are less effective or more expensive, providing advantages to the present invention.

Wires 78 can be patterned metal wires deposited by evaporation and patterned using photolithographic methods and materials, for example comprising silver, aluminium, titanium, tungsten, copper or other metals. Dielectric layers 88 can comprise dielectric material 89, for example inorganic materials such as oxides such as silicon dioxide and nitrides such as silicon nitrides, or organic polymers, resins and epoxies. Dielectric layers 88 can be coated by Plasma Enhanced Chemical Vapour Deposition (PECVD), spray, slot, or spin coating, or other methods known in the photolithographic arts.

According to some embodiments of the present disclosure, first wires 71 are electrically connected to electronic circuit 22, second wires 72 are electrically connected to electronic circuit 22, or both. Electrically connecting first and second wires 71, 72 to electronic circuit 22 provides a system that operates, controls or responds to electrical or magnetic signals or fields and can be responsive to an external controller or other external system.

Embodiments of the present disclosure provides advantages in small devices and systems and enables core 52 structure with reduced size that are not otherwise readily achieved with similar performance by conventional means. According to some embodiments, (i) magnetic flux concentrator 50 has a lateral dimension of 130 microns or less, 100 microns or less, or 50 microns or less, (ii) magnetic flux concentrator 50 has a thickness of 15 microns or less, 10 microns or less, or 5 microns or less, or (iii) both (i) and (ii). Such a small magnetic flux concentrator 50 can tolerate mechanical stress with respect to substrate 20 from heat when provided on a thin stress-reduction layer 54 such as a ductile metal like aluminium. In contrast, devices of the prior art are larger and require thicker stress-reduction layers (such as polyimide layer 55 in FIG. 12), increasing the prior-art device size and distance between an MFC and Hall-effect plate.

According to some embodiments of the present disclosure, magnetic-flux-concentrator structure 10 comprises a magnetic sensor 60 disposed at least partially in first metal layer 41, for example in first wire layer 31, first dielectric layer 81, or both. Magnetic sensor 60 can comprise a magnetic-sensor circuit 64 electrically connected to one or more sensing plates 62, such as a Hall-effect plate. Magnetic-sensor circuit 64 can comprise doped or implanted semiconductor structures that have feature sizes less than or equal to 200 nm, less than or equal to 180 nm, or less than or equal to 110 nm made with photolithographic method and materials and can be a mixed-signal or analog circuit. Magnetic sensor 60 can be a Hall-effect sensor comprising one or more Hall-effect sensing plates 62. In some embodiments a magnetic sensor can be a magneto-resistor or other material with electronic properties modulated by a magnetic field. Sensing plates 62 can be a distance removed from magnetic-sensor circuit 64. In some embodiments magnetic sensor 60 is disposed between substrate 20 and first metal layer 41, in substrate 20 or on a side of substrate 20 opposite magnetic flux concentrator 50. First wires 71 can be electrically connected to magnetic-sensor circuit 64 or electronic circuit 22, second wires 72 can be electrically connected to magnetic-sensor circuit 64 or electronic circuit 22, or both, for example electrically connected to magnetic-sensor circuit 64 and electronic circuit 22. Sensing plates 62 can be electrically connected to magnetic-sensor circuit 64 with four electrical connections, for example providing a current through sensing plates 62 and sensing a corresponding voltage differential across sensing plates 62 when in the presence of a magnetic field. Therefore, in the embodiments of FIGS. 2 and 6, wire 78 electrically connecting each sensing plate 62 to a circuit (e.g., magnetic-sensor circuit 64) can be a bus comprising at least four individual wires. In some embodiments at least a portion of magnetic sensor 60 or sensing plate 62 is within 10 microns, 8 microns, 5 microns, 3 microns, 2 microns or 1 micron of magnetic flux concentrator 50. Sensing plates 62 can be disposed in doped semiconductor regions of substrate 20, for example in the same layers as a CMOS circuit or the same layers as magnetic-sensor circuit 64. Although magnetic-sensor circuit 64 is shown in FIG. 1 as a separate circuit from electronic circuit 22, it can be incorporated into electronic circuit 22, or electronic circuit 22 and magnetic-sensor circuit 64 can be a common circuit. Magnetic flux concentrator 50 can be disposed at least partially above sensing plate 62 in a direction orthogonal to a surface of substrate 20, for example sensing plate 62 can be disposed directly beneath an edge of core 52.

By electrically connecting first or second wires 71, 72 to magnetic sensor 60 (or electronic circuit 22, or both) and disposing Hall-effect sensing plates 62 in a doped semiconductor region of substrate 20, a highly integrated and sensitive magnetic sensor 60 is provided. In integrated circuit manufacturing, individual wires 78 in metal layers 48 can be separated by only a few microns or less, so that disposing sensing plates 62 in a doped semiconductor region of substrate 20 adjacent to magnetic flux concentrator 50 in second metal layer 42 provides a highly integrated and sensitive magnetic sensor 60.

Figure 5:
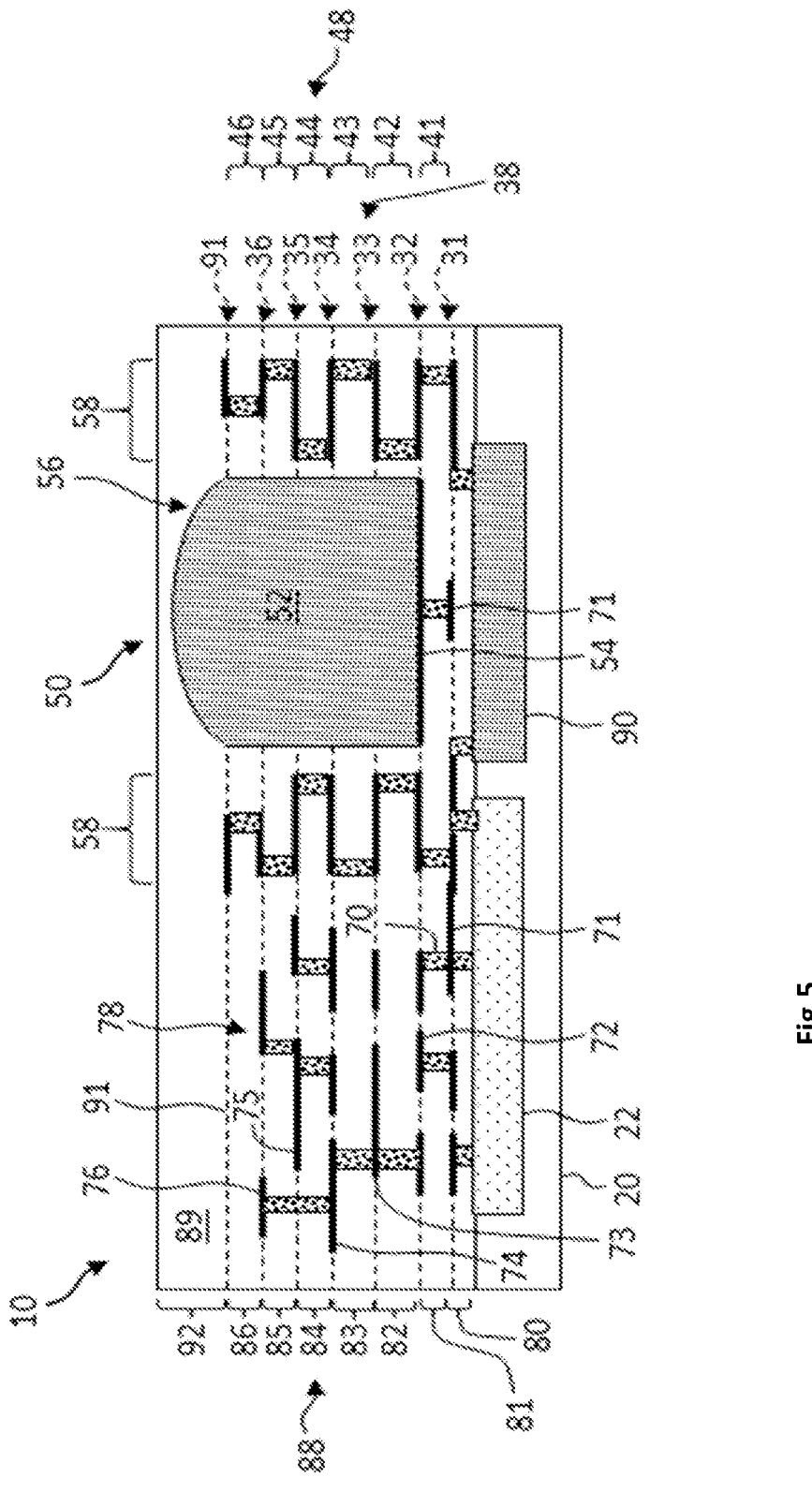
FIG. 5 represents a cross section comprising a coil and a transformer/electromagnet circuit according to illustrative embodiments of the present invention.

Referring to FIGS. 3-6, according to some embodiments, magnetic-flux-concentrator structure 10 comprises more than two metal layers 48 (e.g., first and second metal layers 41 42). For example, magnetic-flux-concentrator structure 10 can comprise third and fourth metal layers 43, 44 comprising third and fourth wire layers 33, 34 comprising third and fourth wires 73, 74. In some embodiments magnetic-flux-concentrator structure 10 can comprise fifth and sixth metal layers 45, 46 comprising fifth and sixth wire layers 35, 36 comprising fifth and sixth wires 75, 76 (as shown in FIG. 5).

Figure 6:
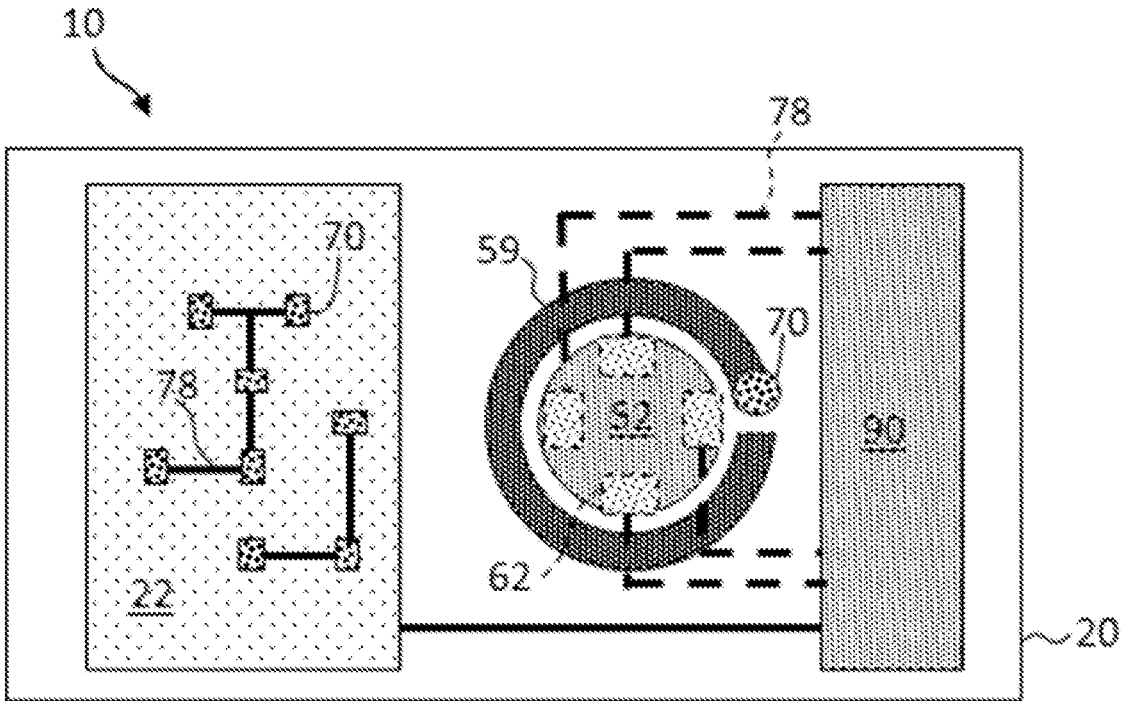
FIG. 6 represents a partial plan view according to illustrative embodiments of the present invention similar to FIG. 5.

As shown in FIG. 3, magnetic-flux-concentrator structure 10 can comprise one or more wires 78 disposed in or on substrate 20 in a coil 58 around magnetic flux concentrator 50, for example around core 52. Wires 78 in coil 58 can be first, second, third, or fourth wires 71, 72, 73, 74 disposed in first, second, third or fourth wire layers 31, 32, 33, 34 of first, second, third or fourth metal layers 41, 42, 43, or 44 (and, in some embodiments can include additional wires 78 in additional wire layers 38 of additional metal layers 48, as shown in FIG. 5). Wires 78 in different wire layers 38 of coil 58 can be electrically connected through electrical vias 70 and disposed in a circle or arc, as shown in FIG. 6. Wires 78 in coils 58 can form one or more windings around core 52 to provide an electromagnet or transformer and can be controlled by or responsive to a transformer/electromagnet circuit 90. For example, wires 78 in coils 58 can form a single winding or primary and secondary windings around core 52. Transformer/electromagnet circuit 90 can comprise doped or implanted semiconductor structures that have a feature size less than or equal to 200 nm, less than or equal to 180 nm, or less than or equal to 110 nm made with photolithographic method and materials and can be a digital circuit, such as a CMOS circuit, a mixed-signal circuit or an analog circuit. In some such embodiments the magnetic field in the MFC via 56 is perpendicular to substrate 20 so that there is no need for wires 78 disposed beneath MFC via 56 to affect or control the performance of magnetic-flux-concentrator structure 10.

As shown in FIG. 3, magnetic-flux-concentrator structure 10 can comprise a wire redistribution layer comprising coil wires 59 or a wire redistribution layer provided in a top wire layer 91, for example provided on the top dielectric layer of the stack of dielectric layers 88. In some embodiments, and for this application, the magnetic field is desirably parallel to substrate 20. Thus, for every coil wire 59 above core 52, at least one coil wire 59 can be provided in wire layers 38 under the core 52, preferably in first metal layer 41 (or in metal layers 48 below first metal layer 41, if present) where stress-reduction layer 54 is disposed in second metal layer 42.

Such coil wires 59 can be a portion of coils 58 or can form a redistribution layer that provides electrical contacts to external devices or electrical connections at a lower resolution than magnetic-flux-concentrator structure 10 itself. Because magnetic flux concentrator 50 is relatively small and can have a low profile over substrate 20, wire redistribution layers can be disposed over magnetic flux concentrator 50. This enables cost effective fabrication of coils 58 with a magnetic core 52 allowing on-chip realisation of transformers, voltage converters, and active magnetic field generation in magnetic flux concentrator 50 for electromagnets and magnetic feedback control.

As also shown in FIG. 3, wires 78 (e.g., first through fourth wires 71-74) in wire layers 38 (e.g., first through fourth wire layers 31-34) separated by dielectric layers 88 (e.g., first, second, third and fourth dielectric layers 81, 82, 83, 84) forming metal layers 48 (e.g., first, second, third and fourth metal layers 41, 42, 43, 44) on planarizing dielectric layer 80 can electrically connect electronic circuit 22 and transformer/electromagnetic circuit 90 in substrate 20 through electrical vias 70 or form portions of coils 58.

Referring to FIG. 4, core 52 can extend beyond MFC via 56 and into and over or above the top dielectric layer of the stack of dielectric layers 88 or over a substrate 20 passivation layer, for example forming a mushroom shape. If present, an encapsulation layer 92 can protect core 52 from environmental stresses and contaminants and, if present, coil wires 59 or a wire redistribution layer can be disposed on encapsulation layer 92, either directly over core 52 (as shown in FIG. 4), or over other portions of substrate 20, or directly on the top dielectric layer of the stack of dielectric layers 88.

FIG. 5 illustrates some embodiments of the present disclosure in which core 52 extends into encapsulation layer 92 but does not extend over portions of substrate 20 beyond MFC via 56, forming a cylindrical shape with a rounded top. As shown in FIG. 5, wires 78 (e.g., first through sixth wires 71-76) in wire layers 38 (e.g., first through sixth wire layers 31-36) separated by dielectric layers 88 (e.g., first through sixth dielectric layers 81-86) forming metal layers 48 (e.g., first through sixth metal layers 41-46) can electrically connect electronic circuit 22 and transformer/electromagnetic circuit 90 through electrical vias 70 or form portions of coils 58.

FIG. 6 provides a plan view of magnetic-flux-concentrator structure 10 with a modified layout comprising a coil 58 disposed around core 52 and stress-reduction layer 54 in MFC via 56 (not shown in FIG. 6), corresponding to FIGS. 3 and 5 and optionally formed partly in a wire redistribution layer with coil wire 59, transformer/electromagnet circuit

90, and electronic circuit 22. Core 52 can be continuous or can have one or more gaps, as shown on the right of the ring in FIG. 6.

Figure 7:
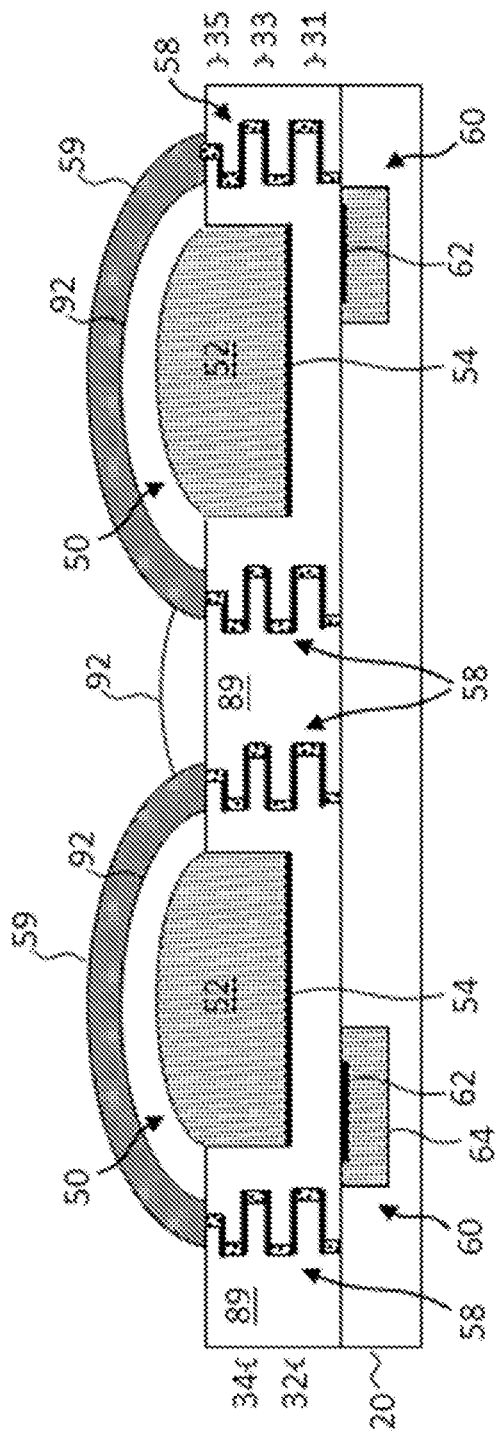
FIG. 7 represents a cross section comprising coils according to illustrative embodiments of the present invention.

Referring to FIG. 7, some embodiments of the present disclosure can comprise multiple magnetic flux concentrators 50 comprising cores 52 in physical contact with stress-reduction layers 54 in substrate 20 with first through fifth wires 71-75, respectively, in first through fifth wire layers 31-35 forming coils 58 in an active electromagnetic field generating device and magnetic sensor 60 with sensing plates 62 and magnetic-sensor circuit 64. An encapsulation layer 92 and coil wire, wire redistribution layer or top wire layer 91 (not shown in FIG. 7) is optionally included. In some embodiments, cores 52 can comprise shapes such as a torus or ring (for example, the two cores 52 illustrated in the FIG. 7 cross section can be physically connected, for example in a torus) to form a single core 52.

Figure 9:
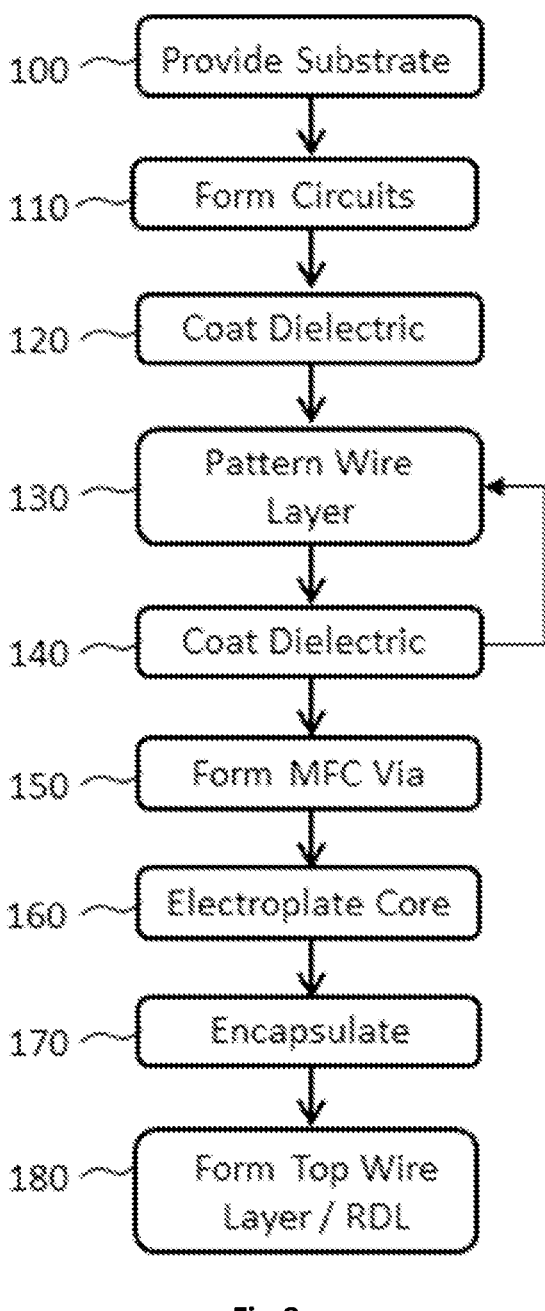
FIGS. 9 and 10 represent flow diagrams of methods according to illustrative embodiments of the present invention.

Referring to the FIG. 9 flow diagram, methods of constructing a magnetic-flux-concentrator structure 10 according to some embodiments of the present disclosure can comprise providing substrate 20 in step 100 and forming circuits (e.g., any combination of electronic circuit 22, magnetic-sensor circuit 64, and transformer/electromagnet circuit 90) in or on substrate 20 in step 110. In step 120 an optional planarizing dielectric layer 80 is disposed on substrate 20 and any circuits formed thereon, together with any electrical vias 70. In some embodiments a substrate 20 is provided with circuits and an optional planarizing dielectric layer 80 formed in or on substrate 20 so that steps 110 and 120 are incorporated into step 100. Metal layers 48 are formed in steps 130 and 140 by coating and patterning a wire layer 38 in step 130 to form wires 78 and then disposing dielectric layer 88 on wire layer 38 in step 140. The successive steps 130 and 140 of forming wires 78 in a patterned wire layer 38 and dielectric layer 88 can be iteratively repeated to form as many metal layers 48 as desired, for example first and second metal layers 41, 42 (as shown in FIG. 1), first through fourth metal layers 41-44 (as shown in FIG. 3), or first through sixth metal layers 41-46 (as shown in FIG. 5). In some embodiments the electroplating current passes through substrate 20, for example through a silicon wafer comprising substrate 20. Optionally, an externally electrically accessible first wire 71, second wire 72, or first wire 71 electrically connected through an electrical via 70 to a second wire 72 that can serve as an electroplating electrode is formed in first or second wire layers 31, 32. In some embodiments of the present disclosure, a seal ring 49 around electronic circuit 22 or magnetic-flux-concentrator structure 10 (shown in FIGS. 1 and 2) can serve as an electrical contact between substrate 20 and second metal layer 42. According to some embodiments, a seal ring 49 consists of all metal layers 48 (for example forming a metal wall around magnetic flux concentrator structure 10) and is provided to stop ions and moisture entering from the side of the structure 10. A seal ring 49 can be formed around electronic circuit 22 and substrate 20, can be highly conductive, has a large contact area, and therefore offers a very low contact resistance and can provide large currents for electroplating core 52. Magnetic-flux-concentrator structure 10 can be provided on a wafer having many such structures. The seal rings 49 can then also distribute a plating current from the wafer edge to all the individual magnetic-flux-concentrator structures 10 and, in particular, to seed layers 57.

Once the final dielectric layer 88 is disposed over substrate 20, an MFC via 56 can be formed in one or more of dielectric layers 88, for example by pattern-wise etching down to second wire layer 32 or to first wire layer 31, in step 150, as shown in FIGS. 1, 3, 5, 7 and 8. In some embodiments, MFC via 56 extends to a first wire 71 in first wire layer 31, as shown in FIG. 8. For clarity, FIG. 8 does not show any other wire layers 38 or metal layers 48. Metal forming first or second wire layers 31, 32 or stress-reduction layer 54, for example aluminium, can serve as an etch stop when etching MFC via 56.

Figure 10:
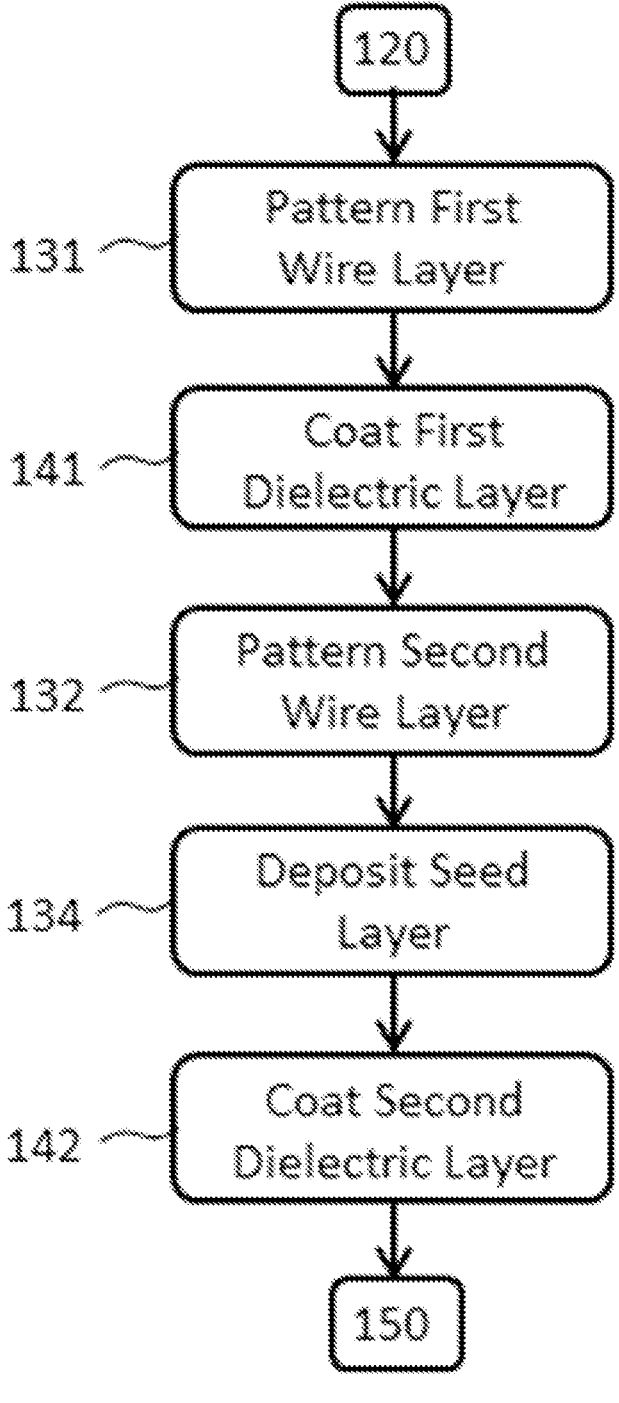
Figure 11:
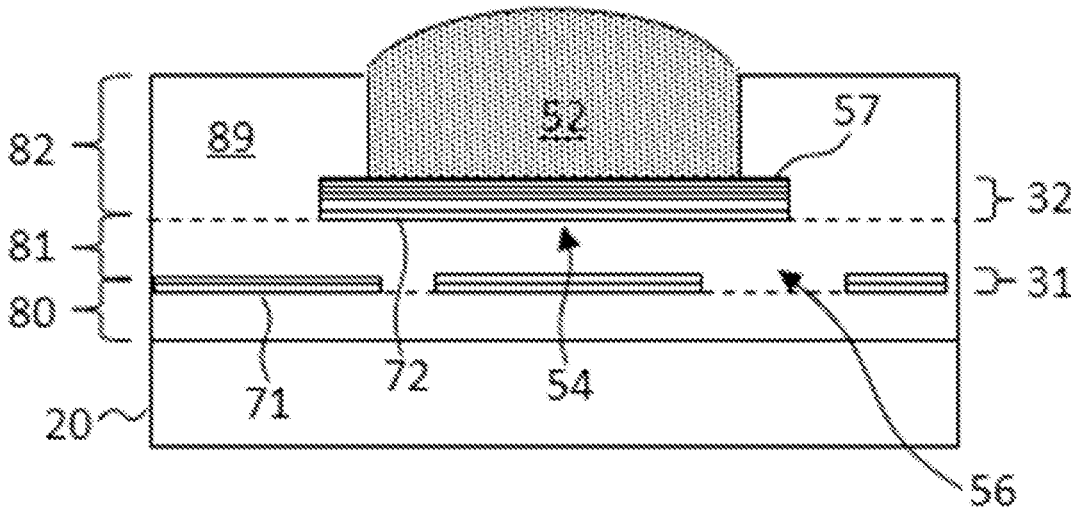
FIG. 11 represents a detail cross section of a magnetic flux concentrator and via according to illustrative embodiments of the present invention.

In some embodiments of the present invention, and as illustrated in FIGS. 1, 3, 5, 7 and 8, stress-reduction layer 54 is disposed at least partially at the bottom of MFC via 56, and is an electrically conductive wire 78, for example a first wire 71 in first wire layer 31 or second wire 72 in second wire layer 32, having an area that is as large as, or larger than, the area of the bottom of MFC via 56. Referring to the detailed flow diagram of FIG. 10 and detailed structures of FIG. 11, after planarizing dielectric layer 80 is formed in step 120, first wires 71 in wire layer 31 are formed in step 131, first dielectric layer 81 is formed in step 141, second wires 72 are formed in step 132, and a seed layer 57 is deposited on second wires 72 in step 134 so that stress-reduction layer 54 (second wire 72) is coated with an additional seed layer 57 comprising, for example metals disposed by sputtering or evaporating and then patterning a relatively thin layer (for example 50 to 200 nm) of a material useful for electrodeposition, for example copper, nickel, TiW, TiN, gold or platinum, or a combination of these, to facilitate electroplating on the portion of stress-reduction layer 54 exposed in MFC via 56. The additional seed-layer materials can be present on all of first or second wires 31, 32, or not. Seed layer 57 and the last wire layer 38 (e.g., (second wire 72 in second wire layer 32) can be patterned in a common step. Thus, according to some embodiments, stress-reduction layer 54 is a multi-layer comprising a first layer (e.g., second wire 72) that is electrically conductive and ductile and a second layer that is a seed layer 57. The second layer (seed layer 57) is disposed on the first layer (second wire 72). Seed layer 57 can be electrically connected to substrate 20 to provide current for electro-plating core 52 on seed layer 57.

Once the last planarizing dielectric layer is formed in step 140 (e.g., second dielectric layer 82 formed in step 142), the MFC via 56 is formed over stress-reduction layer 54 in step 150 so that only the bottom of MFC via has an exposed seed layer 57, forming an electroplating electrode at the bottom of MFC via 56. Stress-reduction layer 54 can be electrically connected to an external electrical source that provides a current for electroplating stress-reduction layer 54 in step 160 to form core 52 by electrolytic deposition of a metal or metal alloy from a solution in which substrate 20 is immersed. In some embodiments an electroplating current is provided through a semiconductor substrate 20 material itself and the plating current is provided at the wafer edges only. Because only the bottom of MFC via 56 has an exposed seed layer 57 (forming an electroplating electrode) and the walls of MFC via 56 comprise only dielectric material etched to form MFC via 56, no metal or metal alloy is electro-deposited directly on the walls of MFC via 56 and any mechanical connection between core 52 and a dielectric layer (e.g., second dielectric layer 82) is reduced or eliminated.

In order to electrodeposit a relatively large or thick core as seen in the prior art, a seed layer is disposed on the side of MFC via 56 and a mold (typically a resin material) is disposed over the dielectric layer. In contrast, because embodiments of the present invention comprise small, relatively thin cores 52, such electrodeposition is practical instead of such prior-art seed-layer deposition, thus reducing the number of steps required to form core 52. For example, no additional deposition or patterning step is required for a seed layer after MFC via 56 is formed since wire layer 38 patterning can also pattern stress-reduction layer 54 and seed layer 57. Furthermore, electroplating in MFC via 56 from a stress-reduction layer 54 at the bottom of MFC via 56 rather than forming a core 52 using a deposited and patterned seed layer present on the sides of MFC via 56 reduces the adhesion between core 52 and structures in substrate 20, for example passivation or dielectric layers 88. The reduced side adhesion in turn reduces passivation cracks in substrate 20 due to thermal stress; core 52 can expand and shrink somewhat independently from substrate 20, particularly in a vertical direction. Electroplating core 52 also improves core 52 uniformity. Moreover, since no seed layer or mold materials are present over the dielectric layer, there is no need to remove such materials after electrodeposition. Since removing seed and mold layer materials can cause processing problems, avoiding such a removal step provides another advantage for embodiments of the present disclosure.

Optionally, in step 170 an encapsulation layer 92 is disposed over core 52 and any top wire layer 91 or wire redistribution layer is formed in step 180.

Stress-reduction layer 54 can be a metal pad with an effective area and a variety of shapes and, when used as an electroplating electrode can form a variety of core 52 shapes, for example a cylinder (using a disc-shaped stress-reduction layer 54), a cube (using a square stress-reduction layer 54) or a torus (using a ring-shaped stress-reduction layer 54).

Embodiments of the present invention can be operated by providing power, ground and control signals to electronic circuit 22 and any magnetic-sensor circuit 64 or transformer/electromagnet circuits 90 to conduct or respond to signals in wires 78. In some embodiments magnetic sensor 60 can detect and measure ambient magnetic fields or transformer/electromagnet circuits 90 can form magnetic fields or transform the voltage of alternating current signals under the control of electronic circuit 22 and in communication with external systems.

It will be evident to those knowledgeable in the electronic and magnetic arts that the labelling of the various metal layers 48, dielectric layers 88, wire layers 38, and wires 78 is arbitrary and can be provided in any order, for example the topmost metal layer 48 furthest from substrate 20 could be first metal layer 41 rather than the metal layer 48 closest to substrate 20 as illustrated in the Figures.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A magnetic flux concentrator, MFC, structure, comprising:
   a substrate,
   a first metal layer comprising (i) a first wire layer disposed on or over the substrate, the first wire layer comprising first wires conducting electrical signals, and (ii) a first dielectric layer disposed on the first wire layer,
   a second metal layer comprising (i) a second wire layer disposed on or over the first metal layer, the second wire layer comprising second wires conducting electrical signals, and (ii) a second dielectric layer disposed on the second wire layer,
   a third metal layer comprising (i) a third wire layer disposed on or over the second metal layer, the third wire layer comprising third wires conducting electrical signals, and (ii) a third dielectric layer disposed on the third wire layer,
   a magnetic flux concentrator disposed at least partially in or on the first dielectric layer of the first metal layer, in or on the second dielectric layer of the second metal layer, or in or on both the first dielectric layer and the second dielectric layer, such that there are no more than two wire layers between the magnetic flux concentrator and the substrate, and
   a Hall-effect sensor disposed in the substrate,
   wherein the magnetic flux concentrator comprises a core disposed at least partially in the second dielectric layer and a stress-reduction layer disposed in the second wire layer.

2. The magnetic-flux-concentrator structure as in claim 1, wherein the stress-reduction layer has a ductility greater than a ductility of the magnetic flux concentrator, wherein the stress-reduction layer is electrically conductive.

3. The magnetic-flux-concentrator structure as in claim 1, wherein the stress-reduction layer is a multi-layer comprising a first layer that is electrically conductive and ductile and a second layer that is a seed layer, the second layer disposed on the first layer.

4. The magnetic-flux-concentrator structure as in claim 3, wherein the seed layer is electrically connected to the substrate.

5. The magnetic-flux-concentrator structure as in claim 4, comprising an electronic circuit and a seal ring disposed around the electronic circuit, and wherein the seed layer is electrically connected to the substrate through the seal ring.

6. The magnetic-flux-concentrator structure as in claim 1, wherein the magnetic flux concentrator is mechanically isolated from the second dielectric layer.

7. The magnetic-flux-concentrator structure as in claim 1, wherein the second dielectric layer comprises an MFC via and wherein the magnetic flux concentrator is disposed at least partially in the MFC via.

8. The magnetic-flux-concentrator structure as in claim 1, comprising one or more wires disposed in or on the substrate, the wires forming one or more coils around the magnetic flux concentrator.

9. The magnetic-flux-concentrator structure as in claim 1, wherein the substrate is a semiconductor substrate comprising an electronic circuit disposed in or on the semiconductor substrate and wherein the electronic circuit has a feature size less than or equal to 200 nm, less than or equal to 180 nm, or less than or equal to 110 nm.

10. The magnetic-flux-concentrator structure as in claim 1, wherein the magnetic flux concentrator has (i) a lateral dimension of 130 microns or less, 100 microns or less, or 50 microns or less, (ii) the magnetic flux concentrator has a thickness of 15 microns or less, 10 microns or less, or 5 microns or less, or (iii) both (i) and (ii).

11. The magnetic-flux-concentrator structure as in claim 1, wherein the Hall-effect sensor comprises Hall-effect plates in a process side of the substrate.

12. The magnetic-flux-concentrator structure as in claim 1, wherein at least a portion of the Hall-effect sensor is within 10 microns, 8 microns, 5 microns, 3 microns, 2 microns or 1 micron of the magnetic flux concentrator.

13. A method of making a magnetic-flux-concentrator structure, comprising:
    providing a substrate;
    disposing a first metal layer on or over the substrate, the first metal layer comprising (i) a first wire layer disposed on or over the substrate, the first wire layer comprising first wires conducting electrical signals, and (ii) a first dielectric layer disposed on the first wire layer;
    disposing a second metal layer on or over the first metal layer, the second metal layer comprising (i) a second wire layer disposed on or over the first metal layer, the second wire layer comprising second wires conducting electrical signals, and (ii) a second dielectric layer disposed on the second wire layer;
    disposing a third metal layer on or over the second metal layer, the third metal layer comprising (i) a third wire layer disposed on or over the second metal layer, the third wire layer comprising third wires conducting electrical signals, and (ii) a third dielectric layer disposed on the third wire layer;
    disposing a magnetic flux concentrator at least partially in or on the first dielectric layer of the first metal layer, in or on the second dielectric layer of the second metal layer, or in or on both the first dielectric layer and the second dielectric layer, such that there are no more than two wire layers between the magnetic flux concentrator and the substrate; and
    disposing a Hall-effect sensor in the substrate,
    wherein the magnetic flux concentrator comprises a core disposed at least partially in the second dielectric layer and a stress-reduction layer disposed in the second wire layer.

14. The method as in claim 13, comprising disposing an electroplating seed layer on the second wire layer before disposing the second dielectric layer.

15. A magnetic flux concentrator, MFC, structure, comprising:
    a substrate,
    a first metal layer comprising (i) a first wire layer disposed on or over the substrate, the first wire layer comprising first wires conducting electrical signals, and (ii) a first dielectric layer disposed on the first wire layer,
    a second metal layer comprising (i) a second wire layer disposed on or over the first metal layer, the second wire layer comprising second wires conducting electrical signals, and (ii) a second dielectric layer disposed on the second wire layer,
    a third metal layer comprising (i) a third wire layer disposed on or over the second metal layer, the third wire layer comprising third wires conducting electrical signals, and (ii) a third dielectric layer disposed on the third wire layer, a magnetic flux concentrator disposed at least partially in or on the first metal layer, in or on the second metal layer, or in or on both the first metal layer and the second metal layer, such that there are no more than two wire layers between the magnetic flux concentrator and the substrate, electrical vias disposed through one or more of the first dielectric layer and the second dielectric layer, and a Hall-effect sensor disposed in the substrate, wherein the magnetic flux concentrator comprises a core disposed at least partially in the second dielectric layer and a stress-reduction layer disposed in the second wire layer.

16. The magnetic-flux-concentrator structure as in claim 15, wherein the first wire layer and the second wire layer are electrically connected through the electrical vias.

17. The magnetic-flux-concentrator structure as in claim 15, wherein the second dielectric layer comprises an MFC via and wherein the magnetic flux concentrator is disposed at least partially in the MFC via.

18. The magnetic-flux-concentrator structure as in claim 15, comprising one or more wires disposed in or on the substrate, the wires forming one or more coils around the magnetic flux concentrator.

19. The magnetic-flux-concentrator structure as in claim 15, wherein the Hall-effect sensor comprises Hall-effect plates in a process side of the substrate.

* * * * *